United States Patent
Cerio, Jr.

(10) Patent No.: US 7,892,406 B2
(45) Date of Patent: Feb. 22, 2011

(54) IONIZED PHYSICAL VAPOR DEPOSITION (IPVD) PROCESS

(75) Inventor: Frank M. Cerio, Jr., Schenectady, NY (US)

(73) Assignee: Tokyo Electron Limited, Tokyo (JP)

( * ) Notice: Subject to any disclaimer, the term of this patent is extended or adjusted under 35 U.S.C. 154(b) by 1126 days.

(21) Appl. No.: 11/091,741

(22) Filed: Mar. 28, 2005

(65) Prior Publication Data

US 2006/0213764 A1 Sep. 28, 2006

(51) Int. Cl.
C23C 14/54 (2006.01)

(52) U.S. Cl. .............. 204/192.32; 204/192.12; 204/192.15; 204/298.09; 204/298.08

(58) Field of Classification Search .......... 204/192.12, 204/192.15, 192.32, 298.08, 298.09
See application file for complete search history.

(56) References Cited

U.S. PATENT DOCUMENTS

| | | | |
|---|---|---|---|
| 5,637,533 A | 6/1997 | Choi | |
| 6,051,114 A | 4/2000 | Yao et al. | |
| 6,080,287 A | 6/2000 | Drewery et al. | |
| 6,100,200 A * | 8/2000 | Van Buskirk et al. | 438/697 |
| 6,132,564 A | 10/2000 | Licata | |
| 6,197,165 B1 | 3/2001 | Drewery et al. | |
| 6,274,008 B1 * | 8/2001 | Gopalraja et al. | 204/192.17 |
| 6,287,435 B1 | 9/2001 | Drewery et al. | |
| 6,444,099 B1 | 9/2002 | Sasaki | |
| 6,458,252 B1 | 10/2002 | Russell | |
| 6,642,146 B1 | 11/2003 | Rozbicki et al. | |
| 6,755,945 B2 | 6/2004 | Yasar et al. | |
| 7,041,201 B2 | 5/2006 | Gung et al. | |
| 7,588,667 B2 | 9/2009 | Cerio, Jr. | |
| 2003/0022454 A1 | 1/2003 | Wang et al. | |
| 2003/0034244 A1 * | 2/2003 | Yasar et al. | 204/192.3 |
| 2004/0188239 A1 | 9/2004 | Robison et al. | |

FOREIGN PATENT DOCUMENTS

| | | |
|---|---|---|
| JP | 09-036040 | 2/1997 |
| TW | 390009 A * | 5/2000 |

OTHER PUBLICATIONS

U.S. Patent and Trademark Office, Non-Final Office Action received in related U.S. Appl. No. 10/811,326, dated Jan. 9, 2008.

(Continued)

Primary Examiner—Nam X Nguyen
Assistant Examiner—Jason M Berman
(74) Attorney, Agent, or Firm—Wood, Herron & Evans, L.L.P.

(57) ABSTRACT

An iPVD system is programmed to deposit uniform material, such as barrier material, into high aspect ratio nano-size features on semiconductor substrates using a process which enhances the sidewall coverage compared to the field and bottom coverage(s) while minimizing or eliminating overhang within a vacuum chamber. The iPVD system is operated at low target power and high pressure >50 mT to sputter material from the target. RF energy is coupled into the chamber to form a high density plasma. A small RF bias (less than a few volts) can be applied to aid in enhancing the coverage, especially at the bottom.

30 Claims, 8 Drawing Sheets

OTHER PUBLICATIONS

U.S. Patent and Trademark Office, Final Office Action received in related U.S. Appl. No. 10/811,326, dated Jun. 20, 2008.

U.S. Patent and Trademark Office, Non-Final Office Action received in related U.S. Appl. No. 10/811,326, dated Jan. 13, 2009.

U.S. Patent and Trademark Office, Final Office Action received in related U.S. Appl. No. 10/811,326, dated Jun. 30, 2009.

U.S. Patent and Trademark Office, Search Report and Written Opinion received in related PCT/US07/65756, dated Jul. 17, 2008.

Summary Abstract: Reactively sputtered $RUO_2$ and $MoO$ diffusion barriers, J. Vac. Sci. Technol. B 5 (6), Nov./Dec. 1987, pp. 1748-1749.

U.S. Patent and Trademark Office, Non-Final Office Action received in related U.S. Appl. No. 11/279,064, dated Jul. 21, 2008.

U.S. Patent and Trademark Office, Final Office Action received in related U.S. Appl. No. 11/279,064, dated Mar. 4, 2009.

U.S. Patent and Trademark Office, Advisory Action received in related U.S. Appl. No. 10/811, 326, dated Oct. 5, 2009.

U.S. Patent and Trademark Office, Non-Final Office Action received in related U.S. Appl. No. 10/811,326; dated Feb. 17, 2010, 14 pgs.

\* cited by examiner

IONIZED PHYSICAL VAPOR DEPOSITION (IPVD) PROCESS

This application is related to commonly assigned and co-pending U.S. patent application Ser. No. 10/795,093, filed Mar. 5, 2004, which is a Continuation-in-Part of U.S. Pat. No. 6,755,945, which claims the benefit of U.S. Provisional Patent Application No. 60/288,952, hereby expressly incorporated herein by reference. This application is also related to U.S. patent application Ser. No. 10/811,326, filed Mar. 24, 2004, hereby expressly incorporated by reference herein.

FIELD OF THE INVENTION

The invention relates to the metallization of via and trench structures on semiconductor wafers. More particularly, the invention relates to the metallization of high aspect ratio via and trench structures of silicon wafers utilizing ionized sputtered materials to form barrier and seed layers of the substrates.

BACKGROUND OF THE INVENTION

In the metallization of high aspect ratio vias and trenches on semiconductor wafers, it is required that the barrier and seed layer have good sidewall coverage.

Ionized PVD deposition is used for barrier and seed layer metallization in advanced IC wafers. Ionized PVD provides good sidewall and bottom coverage in via and trench structures. However, as the geometries shrink and as the via dimensions go down below 0.15 micrometers, ionized deposition requirements become more critical. Therefore, it is highly desirable to have an ionized PVD process where bottom and sidewall coverage are well balanced and overhang is minimized.

Accordingly, there is a need to further control step coverage of the metal or the overhang that typically develops during the deposition step.

SUMMARY OF THE INVENTION

The present invention is based in part upon the determination by the inventors that a delay between the application of target power in an iPVD process and the application of RF substrate bias power can have an unfavorable net deposition of material, and further, that such unfavorable net deposition can contribute to the production of overhangs.

The present invention is further based in part upon the determination by the inventors that the coupling of target power from a target power source to a target positioned within the deposition system while substantially simultaneously coupling RF substrate bias power from an RF bias generator to a wafer table in the processing chamber of the system avoids the unfavorable deposition of material that contributes to the formation of overhangs.

In accordance with certain principles of the present invention, an iPVD system is operated by substantially simultaneously coupling target power to a target and bias power to a substrate wafer table at the time that a high density plasma is created within the processing chamber.

In certain embodiments of the invention, an iPVD system is operated by substantially simultaneously coupling DC target power to a target and RF bias power to a substrate at the time that a high density inductively coupled plasma is initially created within the processing chamber during a No-Net-Deposition (NND) processing time, after the positioning of a patterned substrate wafer into the chamber and after the establishment of process parameters during a preprocessing time that precedes the NND processing time.

According to an embodiment of the invention, a method of operating a deposition system to perform a No Net Deposition (NND) process is provided comprising positioning a patterned substrate on a wafer table within a processing chamber; establishing a first set of process parameters during a preprocess time by flowing a process gas into the processing chamber from a gas supply system to the processing chamber, and coupling ICP power from an ICP source with an antenna to the processing chamber; creating a high density plasma within the processing chamber during an NND processing time by coupling target power from a target power source to a target positioned within the deposition system, and substantially simultaneously with the coupling of target power to the target, coupling RF substrate bias power from an RF bias generator to a wafer table in the processing chamber; and exposing the patterned substrate to the high-density plasma during the NND processing time.

According to certain embodiments of the invention, a method of operating a deposition system to perform a No-Net-Deposition (NND) process is provided that includes positioning a patterned substrate on a wafer table within a processing chamber; establishing a first set of process parameters during a preprocess time in which a first process gas is flowed into the processing chamber, and the deposition system comprises a gas supply system coupled to the processing chamber, and a first ICP power level is provided to an antenna coupled to the processing chamber; and the deposition system further comprising an inductively coupled plasma (ICP) source coupled to the antenna, the ICP source operating at a first ICP frequency; creating a high density plasma by providing a first target power to a target positioned within the processing chamber during an NND processing time, where the deposition system further comprises a target power source coupled to the target and by providing substantially simultaneously a first RF substrate bias power to the wafer table in the processing chamber during the NND processing time, where the deposition system further comprises an RF bias generator coupled to the wafer table; and exposing the patterned substrate to the high-density plasma during the NND processing time.

Processes according to the present invention, a process window is established that produces No-Net-Deposition in the field area and minimizes etching of the sidewall material, whether dielectric or metal.

These and other objects and advantages of the present invention are set forth in the following detailed description of the drawings.

BRIEF DESCRIPTION OF THE DRAWINGS

A more complete appreciation of various embodiments of the invention and many of the attendant advantages thereof will become readily apparent with reference to the following detailed description, particularly when considered in conjunction with the accompanying drawings, in which.

DETAILED DESCRIPTION OF SEVERAL EMBODIMENTS

A process is described in U.S. Pat. No. 6,755,945 by Yasar et al., and assigned to the assignee of the present application, which provides ionized PVD with sequential deposition and etching. While with this type of sequencing the overhang or overburden are much improved over prior processes, some will still form during the deposition sequence and may not be entirely removed in the etch sequence.

Yasar et al. describe a technique to deposit and etch multiple times within a single vacuum chamber. Overhangs are not fundamentally controlled within the deposition step of this process. Higher bias powers are typically used in the deposition step to deposit as much bottom coverage as possible before etching back the bottom to redistribute material to the sidewalls and reduce the bottom coverage, which can add to line resistance. Reduction of overhang is achieved in the subsequent etch steps.

The invention provides a method of operating an ionized physical vapor deposition (iPVD) system to deposit material into nano features on a patterned substrate on a wafer table within a processing chamber in the iPVD system. The method may be used, for example, to deposit a barrier layer using a Low-Net-Deposition (LND) iPVD process, wherein process parameters are adjusted to establish an ultra-low deposition rate in a field area of the patterned substrate. The method may also be used, for example, to deposit a seed layer on the sidewalls of nano features on the patterned substrate using a No Net Deposition (NND) iPVD process, wherein the process parameters are adjusted to cause the net deposition rate to be approximately zero in the field area of the patterned substrate.

The field area refers to the upper surface of the substrate being processed and is the surface into which the high aspect ratio vias and trenches extend. An ultra-low deposition rate as referred to herein is a deposition rate of less than about 30 nanometers per minute (nm/min).

An iPVD processing system can be used for the LND and NND processes. These processes can be typically performed in the vacuum processing chamber of an iPVD apparatus in which the substrate to be coated is held on a support. A high density plasma is maintained in the chamber in a processing gas, which can be, for example, an inert gas into which metal or other coating material vapor has been introduced, usually by sputtering. The high density plasma is usually ionized by coupling RF energy into the process gas, often by an inductive coupling from outside of the chamber. The RF energy ionizes both the process gas and a fraction of the coating material, which may be to a low plasma potential of only a few volts, but may be higher. The processing gas and the ionized coating material can then be directed onto the substrate by control of the bias on the substrate, to either coat or etch the substrate, or both. For the LND and NND processes of the present invention, an iPVD process is run, but with the deposition rates reduced as explained in the examples below. The parameters of the iPVD process are controlled to produce the LND or NND result on the plasma facing surface of the substrate, or field area of the substrate. When so controlled, the iPVD process produces the desired result of deposition of a barrier layer or a seed layer, without producing overhangs around the feature openings.

Exemplary embodiments of the method of the invention are described below, which disclose a deposition technique for use with an iPVD system to metallize high aspect ratio vias and trenches by depositing ionized metal with a flux to the field area surface of the substrate that may produce a flux to the sidewall of the feature. This technique does not rely on an etch sequence to control the conformality of the metal. The deposition process is such that the overhang or overburden is eliminated or minimized, reducing the reliance on or need for the etch step as an overhang control. In the described embodiments, the process involves first depositing a thin layer of a barrier metal such as Ta or TaN and then followed by a seed layer metal such as Cu.

This invention is distinctly different from prior art which teaches high DC powers with high RF bias powers for increased conformality or the case where several deposition and etch steps are performed within or in different vacuum chambers. This process is characterized by very low deposition rates. For example, the DC power can be reduced to reduce the deposition rate to less than 10 nm/min. Additionally, a range of RF substrate biases can be applied to the wafer during the deposition.

Figure 1:
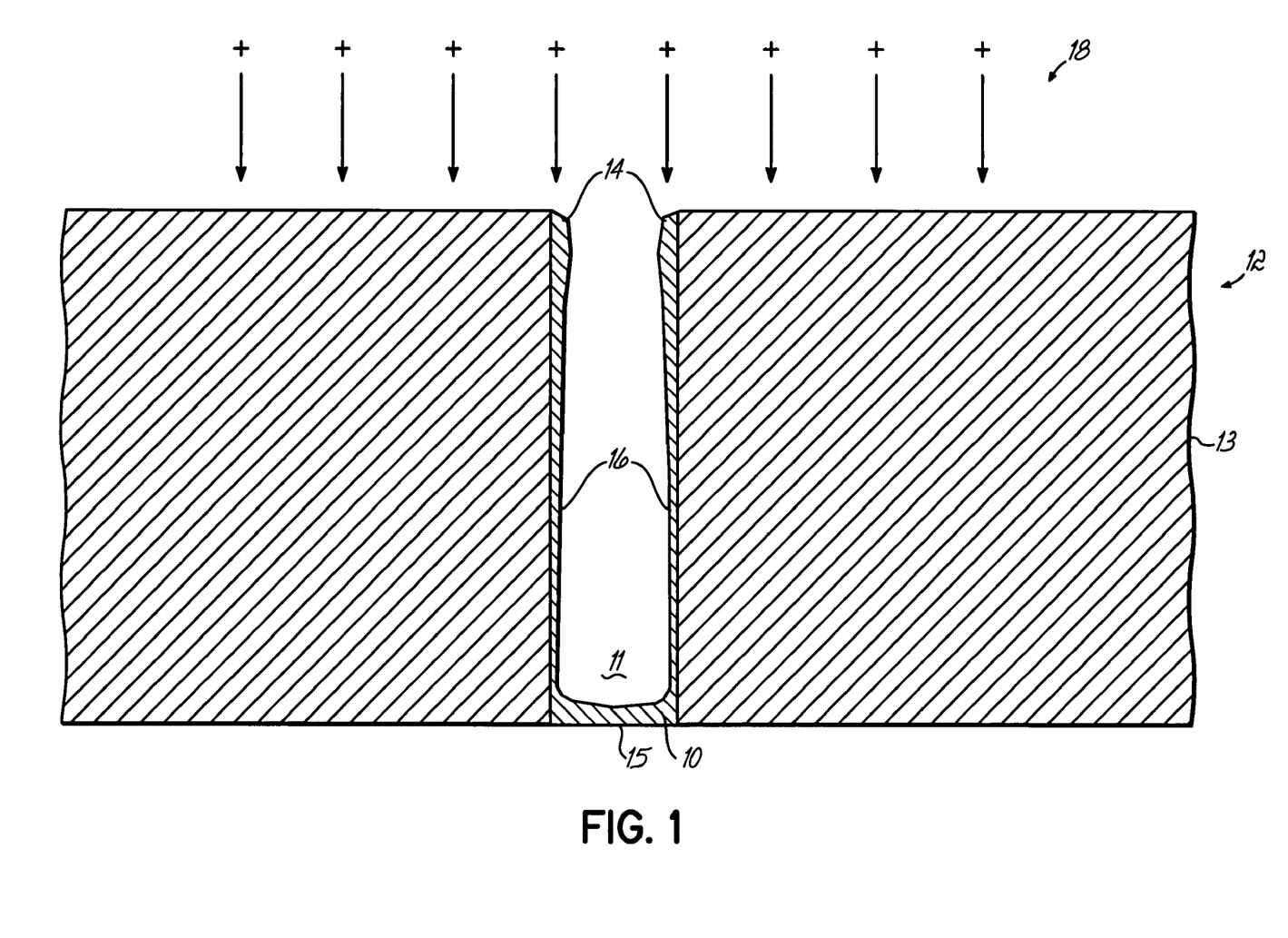
FIG. 1 illustrates a simplified view of a wafer cross section in accordance with an embodiment of the invention.

FIG. 1 illustrates a simplified view of a wafer cross section in accordance with an embodiment of the invention. In the illustrated embodiment, a via structure 11 is shown having a metal film 10 deposited on the sidewalls 16 of the via structure and metal film 10 deposited on the bottom 15 of the via structure. A modified iPVD process is used to deposit the metal film 10 into via structure 11 formed in a dielectric interlayer 13 of a semiconductor wafer 12. As metal ions 18 are deposited onto the wafer 12, the metal deposition has a propensity to become thicker at the via entrance causing an overhang structure 14. The method of the invention can prevent or reduce the overhang structure. Similarly, the deposition of metal at the bottom 15 of the via 11 can become thicker than at the sidewalls 16. The method of the invention provides a more uniform deposition of material on the sidewalls and the bottom of the via.

Figure 2:
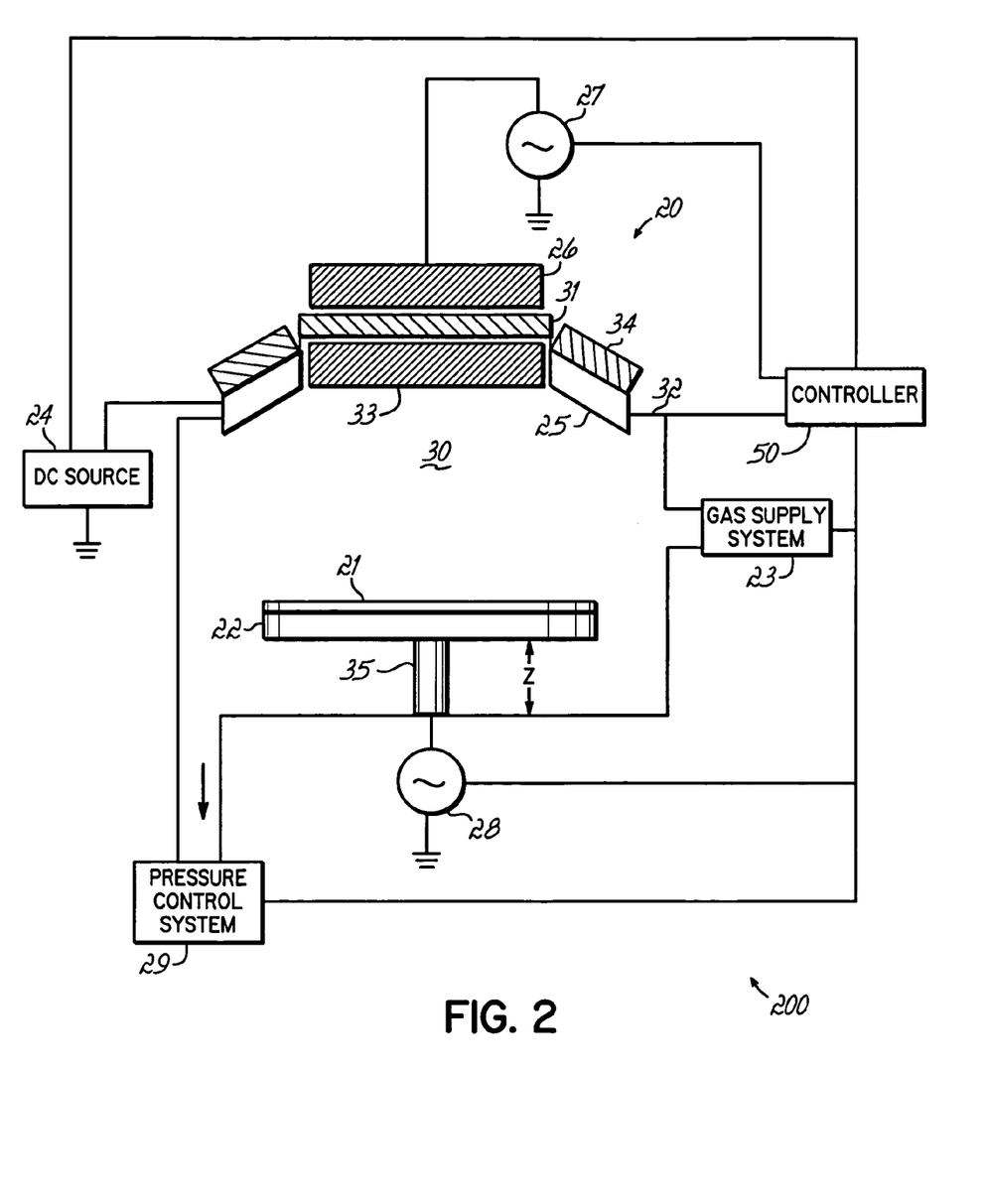
FIG. 2 illustrates an exemplary block diagram of a processing system according to an embodiment of the invention.

FIG. 2 illustrates an exemplary block diagram of a processing system according to an embodiment of the invention. In the illustrated embodiment, an iPVD system 200 is shown.

The iPVD system 200 can comprise an iPVD processing module, a gas supply system 23 coupled to a processing chamber 32, a pressure control system 29 coupled to the processing chamber 32, a first RF source 27 coupled to the processing chamber 32, an RF bias generator 28 coupled to the processing chamber, and a DC source 24 coupled to the processing chamber.

The iPVD system comprises a controller 50 coupled to the processing chamber; coupled to the gas supply system 23; coupled to the pressure control system 29; coupled to the first RF source 27; coupled to the RF bias generator 28; and coupled to the DC source 24.

The iPVD processing module further comprises an antenna 26, a window 31 coupled to the antenna, a louvered deposition baffle 33 coupled to the window, a target 25, and a magnet assembly 34 coupled to the target. RF power can be supplied to the antenna 26 from the RF generator 27, and can be used to create an inductively coupled plasma in the chamber 32.

The antenna 26 can be electrically connected using an RF matching network (not shown) to, and selectively energized or powered by, the RF generator 27. The RF generator 27 can provide a time-varying RF current at a frequency between about 100 kHz and about 100 MHz that is supplied to the antenna 18 at a power ranging between about 100 watts and about 5000 watts. For example, an operating frequency of approximately 13.56 MHz can be used. Alternately, other frequencies can be used. When energized by the RF generator 27, the antenna 26 radiates isotropic RF electromagnetic fields. A metallic outer enclosure or cage (not shown) can be used to surround the antenna to confine the radiated RF electromagnetic fields therein to ensure the safety of nearby persons and to prevent electromagnetic interference with surrounding electronics.

The magnet assembly 34 can be located behind the target 25 and can be used to produce and/or change a static magnetic field shape in a process volume within the chamber. Field lines from the magnets extend into the process volume. In various embodiments of the invention, these or other field lines present in the chamber for purposes of enhancing the process may be caused to change, when switching between different modes, by controlling the magnet configuration or other parameters. Such magnet changes can include physically moving the magnet or any component thereof, for example, toward or away from the substrate, or toward or away from other parts of the coating material source, or by rotating or otherwise reorienting the magnet or magnet component. In the alternative, or in addition, an electromagnet or electromagnet component may be used in which the current is switched or otherwise varied when switching between deposition and etch modes. In most cases, it may be preferable to employ stronger static magnetic fields reaching into the chamber during deposition, particularly sputter deposition, than during etching.

As an alternative to changing the static magnetic field between modes, deposition can be carried out with a weak strength or with no cathode magnet assembly, providing that no static magnetic field or that a low-strength static magnetic field extends into the process volume. As such, no static magnetic field of any significant strength extends sufficiently into the process volume to adversely affect the etching uniformity across the surface of the wafer.

In addition, maintaining higher density plasma conditions during deposition and lower density plasma conditions during etching is particularly advantageous, as explained herein.

Examples of iPVD systems are described in U.S. Pat. Nos. 6,287,435; 6,080,287; 6,197,165 and 6,132,564, and these patents are hereby expressly incorporated herein by reference. Examples of apparatus having reduced and controllable magnetic fields are described in U.S. Pat. App. 20040188239, and this patent application is incorporated herein by reference.

During a typical ionized physical vapor deposition process, magnet field strength of the magnet assembly 34 near the target 25 is expected to increase electron confinement adjacent the target 25, thereby increasing localized ions and increasing the sputtering rate. When a high density plasma is available, the trapping of electrons trapped around the cathode by the magnet assembly 34 is less important for the generating of gas ions. Therefore, the sputtering rate of material from the cathode is less dependent on the local static magnetic field, leaving a desirable cathode erosion pattern as the main reason for maintaining a local static magnetic field. During a typical plasma etch, the high plasma density produced by the ICP source 29 along with the bias voltage on the substrate can be used to control the etching rate.

When the two operations, deposition and etching, are combined in one chamber, the effects of the static magnetic fields produced by the portion of the apparatus responsible for sputtering can negatively interact with the portion of the apparatus responsible for etching by confining the electrons produced by the inductively coupled plasma and thus centralizing the resulting plasma profile. Static magnetic fields can have a negative effect on ICP source uniformity due to peripheral plasma confinement, reducing diffusive radial loss. The following embodiments of the invention achieve a balance between the two systems and effectively produce a sequential deposition and etch apparatus that produces a uniform film on the substrate and uniform feature coverage.

In one embodiment, the configuration of the magnet assembly 34 may accommodate either a reduced strength static magnetic field in vicinity of the target surface or with no static cathode magnetic field. A weak magnet configuration may maintain the static magnetic field shape and orientation of the stand-alone iPVD equipment, so that the field within the target and the nearby plasma generates an optimal erosion profile for high target utilization. Such low or reduced field strength can be maintained constant, throughout both the deposition and etch process, or may be maintained at a level most suitable for the deposition portion of the cycle and switched to a low or absent static magnetic field condition during the etch portion of the cycle.

Some magnet pack configurations for iPVD may typically produce static magnetic field strength at the target surface of over 150 Gauss or several hundred Gauss, to provide confinement of the plasma and a desired erosion profile and high target utilization. Reducing the static magnetic field strength at target surface to about 5-10 Gauss eliminates this confinement effect.

Field strength can be reduced by moving one or more of the magnets in the magnet assembly 34. Field strength may also be reduced by reducing magnetic strength of the magnets, but there is a minimum practical limit to doing this due to long-term stability and magnetic material properties. Reducing the number of magnets in the azimuthal direction also reduces static magnetic field strength, but azimuthal uniformity of the strength of the static magnetic field has also significant impact on target lifetime and utilization and should be taken into account. Modification of the magnet size has limits along the radial direction tangential to target surface, because it may completely change the orientation of the static magnetic field, and thus the utilization of the target.

In one embodiment, a switchable static magnetic field can be established that allows the apparatus controller to set the relative influence of the static magnetic field on the respective modes differently, depending on the process. This may include variable magnet positions or flexible duty cycles, for example, which can vary the amount of the confined plasma at the target surface comparing to total confinement with annular magnet pack that can be changed at any time by the controlling program, or even controlled within one cycle to compensate for another cause of non-uniformities, such as gas flow skew, coil asymmetry, etc.

Advantages in deposition and etch uniformity are provided in the embodiments of the invention that enable the change of the static magnetic field strength of cathode magnets between a deposition mode and an etch mode. In one preferred embodiment, during the etch step, the field is established in such a way that its strength at the substrate is less than about 10 Gauss. Stronger static magnetic fields of more than about 10 Gauss at the substrate tend to concentrate the etch plasma at certain areas of the substrate and tend to cause a non-uniform etch.

In one embodiment, a magnet assembly 34 can be designed to produce a static magnetic field of less than 200 Gauss, preferably less than about 150 Gauss, preferably at least 20-30 Gauss, but possibly even 0 Gauss, at the target surface for deposition.

The antenna 26 can be positioned outside of the chamber 30 behind a dielectric window 31 in the chamber wall 32. A louvered deposition baffle 33, preferably formed of a slotted metallic material, is located inside of the chamber 30 closely spaced from the window 31 to shield the window 31 from deposition. The controller 50 can be used to determine the amount of ICP power to provide and when to have it applied to the antenna. For example, ICP power from the RF generator 27 to the antenna 26 can be switched between different power levels during the deposition process.

The iPVD processing module also comprises a wafer table 22 that is coupled to the processing chamber using a Z-motion drive 35. The Z-motion drive 35 can be used to adjust the substrate-to-source distance to provide the best deposition uniformity, and the best coverage and symmetry of the sidewall 16 and bottom 15 of the via 11. The controller 50 can be used to determine the Target-to-Substrate (TS) separation distances required during the deposition process and provide the control data to the Z-motion drive 35 when it is required. During the improved deposition process, the substrate-to-source distance can typically be 150 to 275 mm.

The wafer table 22 can accommodate a 200 mm wafer, a 300 mm wafer, or a larger wafer. For example, wafer 21 can be transferred into and out of processing chamber 30 through an opening (not shown) that is controlled by a gate valve assembly (not shown). In addition, wafer 21 can be transferred on and off the wafer table using a robotic substrate transfer system (not shown). In addition, wafer 21 can be received by substrate lift pins (not shown) housed within wafer table 22 and mechanically translated by devices housed therein. Once the wafer 21 is received from the transfer system, it can be lowered to an upper surface of the wafer table 22.

During processing, a wafer 21 can be held in place on top of the wafer table 22. For example, an electrostatic chuck can be used as the wafer table 22. In addition, the wafer temperature can be controlled when the wafer is on the wafer table 22. For example, heating and/or cooling elements (not shown) can be used. The temperature of the wafer 21 can be controlled to obtain the best via metallization. The controller 50 can be used to determine and control the wafer temperature. In addition, wafer temperature can be controlled by providing the wafer table 22 with cooling fluid passages and the appropriate temperature controls. Good thermal contact between the wafer table 22 and the wafer 21 can be achieved by providing backside gas conduction between the wafer 21 and the wafer table 22. Backside gas pressure can be controlled during the deposition steps to insure that thin metal deposition, especially at the sidewalls of the via structures, are not agglomerated.

Heat generated at the substrate 21 during processing can be extracted efficiently by the wafer table 22 to keep the temperature of the wafer 21 at substantially below room temperature, preferably below 0°, preferably to about −30° Celsius.

RF bias power can be supplied to the wafer table 22 using the RF bias generator 28, and can be used to provide a wafer bias. The controller 50 can be used to determine the amount of RF bias power to provide and when to have it applied to the wafer table. For example, RF bias power can be turned on to a level appropriate during deposition to control the bias on the wafer 21 to improve and affect the process.

The operating frequency for the RF bias generator 28 can range from 1 MHz to 100 MHz. The RF bias generator 28 can be used to selectively apply a bias potential that accelerates positively charged plasma components toward the substrate. The bias potential provided by the RF bias generator 28 substantially determines the kinetic energies of positive ions attracted to the substrate from the plasma. The RF bias generator 28 typically operates at a frequency of about 13.56 MHz and at a power between about 100 watts and about 1000 watts. It is understood by those of ordinary skill in the art that the RF bias generator 28 may be omitted from the processing system and the substrate table may be either grounded or electrically floating. Alternately, other frequencies can be used, such as 2 MHz or 27 MHz.

Process gas can be provided to the processing chamber 30 by the gas supply system 23. The process gas can comprise a metal-containing gas, an inert gas, or a combination thereof. The inert gas may be argon, which is often used, but may also be any other inert gas or may be a non-inert gas that is compatible with the process.

Chamber pressure can be controlled using the pressure control system 29. For example, process gas can be supplied into the vacuum processing chamber 30 by the gas supply system 23. The chamber pressure can be maintained at a vacuum by the pressure control system 29. The controller can be used to control the flow rate and chemistry for the process gas, and to control the chamber pressure accordingly.

DC power can be supplied from a power source 24 to the target 25. The controller 50 can be used to determine the amount of DC power to provide and when to have it applied to the target. After a certain desired amount of deposition, the DC power 24 to the target 25 is reduced or turned off to substantially reduce or stop the deposition process. In some cases, the deposition process can be substantially reduced and/or stopped by reducing the DC power level 24 to a very low level without completely turning it off.

The controller 50 can be configured to provide control data to the system components and receive process and/or status data from the system components. For example, the controller 50 can comprise a microprocessor, a memory (e.g., volatile or non-volatile memory), and a digital I/O port capable of generating control voltages sufficient to communicate and activate inputs to the iPVD system 200 as well as monitor outputs from the iPVD system 200. Moreover, the controller 50 can exchange information with the system components, and a program stored in the memory can be utilized to control the aforementioned components of an iPVD system 200 according to a process recipe. In addition, the controller 50 can be configured to analyze the process and/or status data, to compare the process and/or status data with target process and/or status data, and to use the comparison to change a process and/or control a system component. In addition, the controller can be configured to analyze the process and/or status data, to compare the process and/or status data with historical process and/or status data, and to use the comparison to predict, prevent, and/or declare a fault.

Figure 3:
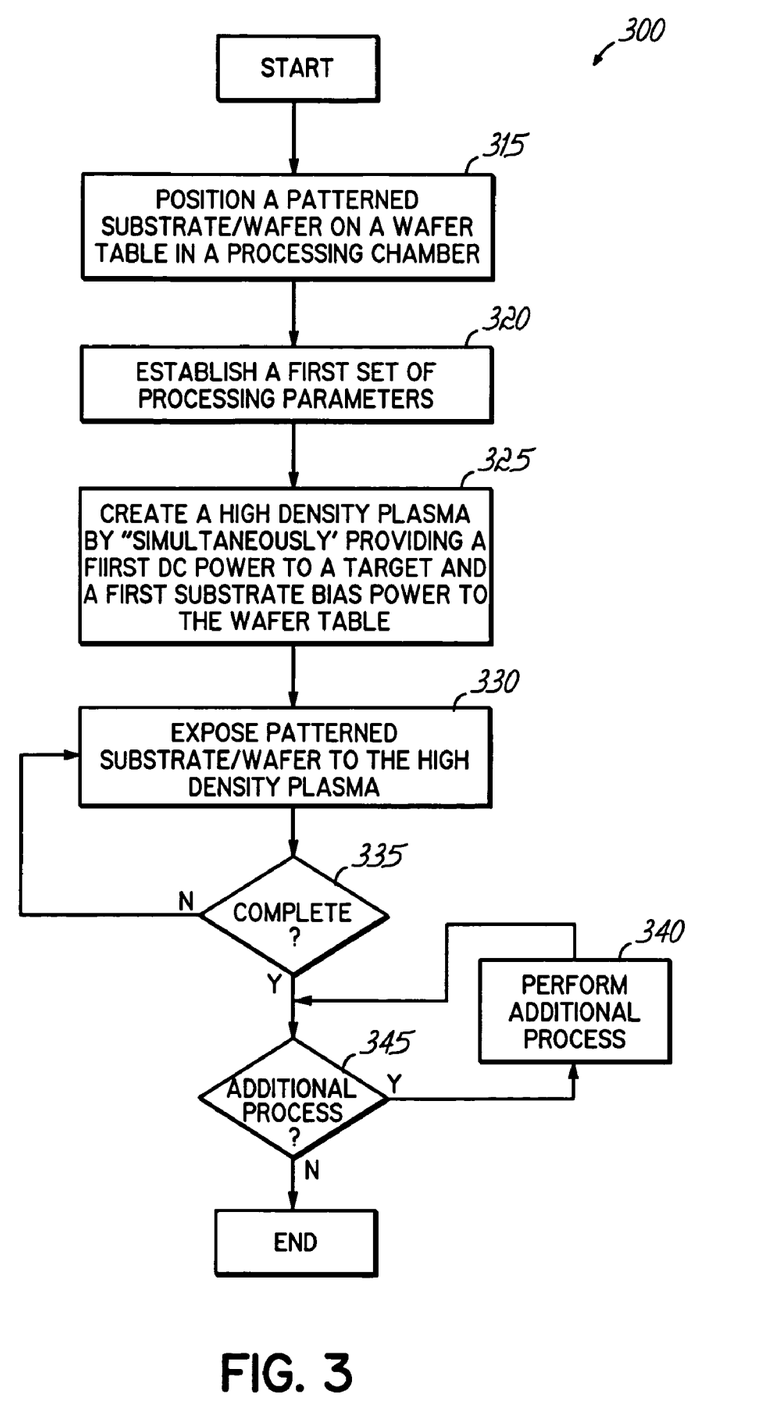
FIG. 3 illustrates a simplified flow diagram of a method of operating a deposition system to perform a process in accordance with an embodiment of the invention.

FIG. 3 illustrates a simplified flow diagram of a method of operating a deposition system to perform a process in accordance with an embodiment of the invention. In the illustrated embodiment, an NND process is shown. In alternate embodiments, other procedures can be performed that may include one or more NND processes, one or more LND processes, and various combinations of LND processes and NND processes. Procedure 300 starts in 310.

In 315, a patterned substrate/wafer can be positioned on a wafer table in a processing chamber as described herein. Alternately, a non-patterned substrate/wafer can be used. For example, the processing chamber can be an iPVD chamber.

In 320, a first set of process parameters can be establish during a preprocess time. For example, during the preprocess time a first process gas can be flowed into the processing chamber using a gas supply system coupled to the processing chamber, and a first ICP power level can be provided to an antenna coupled to the processing chamber. The deposition system can further comprise an ICP source coupled to the antenna, and the ICP source can be operated at a first ICP frequency.

The processing system can also comprise a gas supply system that is coupled to the processing chamber, and the gas supply system can be used to flow process gas into the processing chamber during one or more parts of the NND process. The process gas can comprise an inert gas, a nitrogen-containing gas, an oxygen-containing gas, a metal-containing gas, or a combination thereof.

The nitrogen-containing gas can comprise $N_2$, NO, $N_2O$, and $NH_3$, and the oxygen-containing gas can comprise $O_2$, NO, $N_2O$, and $H_2O$. The inert gas can comprise argon, helium, krypton, radon, xenon, or a combination thereof. The metal-containing gas comprises copper (Cu), tantalum (Ta), titanium (Ti), ruthenium (Ru), iridium (Ir), aluminum (Al), silver (Ag), lead (Pt), or a combination thereof. For example, metal ions can diffuse towards the wafer surface based on the on bias power, and can be affected by a self-bias voltage within a plasma sheath, which is the potential difference between the potential of the plasma and the potential at the wafer surface.

In 325, a first ICP power can be provided to an antenna coupled to the processing chamber. In an alternate embodiment, a different configuration may be used as a plasma source, and an antenna may not be required. The ICP source can be an RF generator, and the ICP source can operate in a frequency range from approximately 1.0 MHz to approximately 100 MHz. For example, the ICP source can be operated at approximately 13.56 MHz. The ICP power can range from approximately 2000 watts to approximately 10000 watts. For example, the ICP power can range from approximately 4500 watts to approximately 5500 watts.

In one embodiment, the wafer table can be vertically translated to establish the required gap between the target and the substrate. Alternately, the gap can be established at a different time. The gap size can range from approximately 100 mm to 400 mm. For example, the gap can range from approximately 200 mm to 270 mm.

In addition, certain embodiments can be configured to have either a reduced strength static magnetic field in vicinity of the target surface or with no static cathode magnetic field. A weak magnet configuration may be used to maintain the static magnetic field shape and orientation so that the field within the target area and the nearby plasma generates an optimal erosion profile for high target utilization. Such low or reduced field strength can be maintained constant in the NND and LND processes, or may be maintained at a level most suitable for the NND portion of the cycle and switched to a different level during the LND and/or standard deposition portion of the cycle. For example, a switchable static magnetic field may be used to provide a weak or zero static magnetic field, for example less than 10 Gauss, in the process volume. Furthermore, a variable/controllable magnetic field may be used to reduce and/or reshape the magnetic field to adjust the field uniformity across the target surface.

In 325, a high density plasma can be created during an NND processing time. For example, the deposition system can further comprise a target power source coupled to a target in the processing chamber and an RF bias generator coupled to the wafer table, and the high density plasma can be created by providing substantially simultaneously a first RF substrate bias power to the wafer table and a first target power to the target during the NND processing time.

In 330, the patterned substrate can be exposed to the high-density plasma during the NND processing time. For example, the high density plasma can comprise a large number of process gas ions. Alternately, the high density plasma can comprise a large number of process gas ions and a large concentration of metal ions.

In one embodiment, a process and an apparatus are provided wherein the simultaneous control of the target power and the RF substrate bias power is used a provide a process that causes a No Net Deposition (NND) in the field area of the substrate. For example, a process can be provided that involves depositing a thin layer of metallization, for example, tantalum (Ta), tantalum nitride (TaN) or copper (Cu) into features of the substrate.

For example, a Cu(NND) process can be performed using the following parameters: a DC power equal to approximately 1000 watts, an ICP power equal to approximately 5250 watts, an RF substrate (table) bias equal to approximately 300 watts, a gap equal to approximately 255 mm, a process time equal to approximately 60 seconds, a deposition rate equal to approximately 30 nm/minute, a chamber pressure equal to approximately 5 mTorr, and an Argon flow rate equal to approximately 130 sccm. In addition, a number of deposition cycles can be perform, and the Cu(NND) process can be repeated a number of times (1-10) without adverse affects.

In another example, a Cu(NND) process can be performed using the following parameters: a DC power equal to approximately 2500 watts, an ICP power equal to approximately 5250 watts, an RF substrate (table) bias equal to approximately 375 watts, a gap equal to approximately 255 mm, a process time equal to approximately 24 seconds, a deposition rate equal to approximately 48 nm/minute, a chamber pressure equal to approximately 5 mTorr, and an Argon flow rate equal to approximately 130 sccm. In addition, a number of deposition cycles can be perform, and the Cu(NND) process can be repeated a number of times (1-10) without adverse affects.

In a different example, a Ta(NND) process can be performed using the following parameters: a DC power equal to approximately 3300 watts, an ICP power equal to approximately 5250 watts, an RF substrate (table) bias equal to approximately 800 watts, a gap equal to approximately 252 mm, a process time equal to approximately 25 seconds, a deposition rate equal to approximately 48 nm/minute, a chamber pressure equal to approximately 5 mTorr, and an Argon flow rate equal to approximately 120 sccm. In addition, a number of deposition cycles can be perform, and the Ta(NND) process can be repeated a number of times (1-10) without adverse affects. When multiple cycles are performed the process parameters can remain constant, or alternately one or process parameters can change during different cycles.

Furthermore, during the NND processing time, a chamber pressure, a chamber temperature, a substrate temperature, a process gas chemistry, a process gas flow rate, a gap size, an ICP power, substrate position, a target power, and an RF substrate bias power can be adjusted to establish and/or maintain the required NND deposition rate. As the NND process is performed material can be deposited into features of the patterned substrate while producing substantially no overhanging material at openings of the features and No-Net-Deposition in the field area of the substrate.

The NND deposition rate can comprise a field deposition rate that is the rate of deposition of material in the field region of the patterned substrate. The field deposition rate can range from approximately −10 nm/min to approximately +10 nm/min. For example, the field deposition rate can range from approximately −3 nm/min to approximately +3 nm/min. The NND deposition rate can comprise a sidewall deposition rate that is the rate of deposition of material on one or more sidewalls of one or more features of the patterned substrate. The sidewall deposition rate can range from approximately 0 nm/min to approximately +10 nm/min. For example, the field deposition rate can range from approximately 0 nm/min to approximately +5 nm/min. The NND deposition rate can comprise a bottom surface deposition rate that is the rate of deposition of material on one or more bottom surfaces of one or more features of the patterned substrate. The bottom surface rate can range from approximately −10 nm/min to approximately +10 nm/min. For example, the bottom surface deposition rate can range from approximately −5 nm/min to approximately +5 nm/min.

During the NND process, the deposition component may add material on the field area on the top surface of the wafer and the etching (sputtering) component may remove an equal amount of material on the field area on the top surface of the wafer, and thus there is No-Net-Deposition at the end of the process cycle on the field area on the top surface of the wafer. In addition, during the NND process, the deposition component may add material on the bottom and/or side surfaces of features on the wafer and the etching (sputtering) component may remove a lesser amount of material on the bottom and/or side surfaces of features on the wafer, and thus there is a net deposition at the end of the process cycle on the bottom and/or side surfaces of features on the wafer. The deposition/etch cycle can be repeated as many times as needed to achieve the desired result. By adjusting the DC level and the RF substrate bias levels, the overhang growth is eliminated or minimized. The overhang may be etched back and redistributed at least partially to the sidewalls. For example, the sputtering component can remove some of the excess material from the via bottom and from the overhangs. When the metal layer is copper, the etch process increases the continuity of the Cu on the bottom and top portions of the feature sidewalls by redeposition of Cu sputtered from the via bottom and from the overhang at the via entrance. If the metal being etched is a barrier layer, the decrease in the thickness at the via bottom reduces the overall contact resistance of the via and improves device performance. To deposit a barrier layer of a metal nitride such as $TaN_x$, nitrogen gas, in addition to Argon gas, is used during sputter deposition.

In 335, a query is performed to determine when the process has been completed. When the process has been completed, procedure 300 continues to 345, and when the process has not been completed, procedure 300 branches back to 330, and procedure 300 continues as shown in FIG. 3. For example, one or more of the NND deposition processes may be performed one or more times.

For example, after a certain desired amount of deposition, the DC power to the target and the RF substrate bias can be simultaneously turned off to substantially stop the deposition process. Those skilled in this art will realize that the deposition process can be substantially reduced and/or stopped by reducing the DC power level to a very low level without completely turning it off.

In 345, a query is performed to determine when an additional process is required. When a decision is made to perform an additional process, procedure 300 branches to 340, and procedure 300 continues as shown in FIG. 3. When a decision is made not to perform a second process, procedure 300 branches to 350 and ends.

In 340, an additional process can be performed. The process results from a previous process can be used to determine the type of process to perform as the additional process.

In one embodiment, the additional process can include performing a POR process, and the POR process can be performed in the same processing chamber. Alternately, the additional process can be performed in a different processing chamber, such as PVD chambers, CVD chambers, and PECVD chambers. A chamber pressure, chamber temperature, substrate temperature, a process gas chemistry, a process gas flow rate, a target material, an ICP power, substrate position, a target power, an RF substrate bias power, or a combination thereof can be adjusted to perform a POR process.

For example, a Cu(POR) process can be performed using the following parameters: a DC power equal to approximately 5750 watts, an ICP power equal to approximately 5250 watts, an RF substrate (table) bias equal to approximately 100 watts, a gap equal to approximately 245 mm, a process time equal to approximately 45 seconds, a deposition rate equal to approximately 53 nm/minute, a chamber pressure equal to approximately 65 mTorr, and an Argon flow rate equal to approximately 500 sccm. In addition, a number of deposition cycles can be perform, and the Cu(POR) process can be repeated a number of times (1-10) without adverse affects.

In another example, a Cu(POR) process can be performed using the following parameters: a DC power equal to approximately 1500 watts, an ICP power equal to approximately 5250 watts, an RF substrate (table) bias equal to approximately 100 watts, a gap equal to approximately 220 mm, a process time equal to approximately 41.4 seconds, a deposition rate equal to approximately 58 nm/minute, a chamber pressure equal to approximately 5 mTorr, and an Argon flow rate equal to approximately 130 sccm.

In a different example, a Cu(POR) process can be performed using the following parameters: a DC power equal to approximately 4500 watts, an ICP power equal to approximately 5250 watts, an RF substrate (table) bias equal to approximately 100 watts, a gap equal to approximately 245 mm, a process time equal to approximately 12.6 seconds, a deposition rate equal to approximately 143 nm/minute, a chamber pressure equal to approximately 5 mTorr, an Argon flow rate equal to approximately 130 sccm.

When multiple cycles are performed the process parameters can remain constant, or alternately one or process parameters can change during different cycles.

In other embodiments, the additional process can include performing a LND process, and the LND process can be performed in the same processing chamber. Alternately, the additional process can be performed in a different processing chamber, such as PVD chambers, CVD chambers, and PECVD chambers. A chamber pressure, chamber temperature, substrate temperature, a process gas chemistry, a process gas flow rate, a target material, an ICP power, substrate position, a target power, an RF substrate bias power, or a combination thereof can be adjusted to perform a LND process. The process parameters can be adjusted to provide a sputtering value in a range below a sputtering threshold during the LND process. For example, an RF generator and a controller can be used, and the RF substrate bias power and the LND target power can be adjusted to achieve an ultra-low deposition rate in the field region of the patterned substrate, the ultra-low deposition rate being less than 30 nm/min.

The target power source can be a DC power source. In an alternate embodiment, the target power source can be an RF generator that can be operated in a frequency range from approximately 1 MHz to approximately 100 MHz. The LND target power can range from approximately 10 watts to approximately 2000 watts. For example, the LND target power can range from approximately 800 watts to approximately 1600 watts.

For example, a TaN(LND1) process can be performed using the following parameters: a DC power equal to approximately 2200 watts, an ICP power equal to approximately 5250 watts, an RF substrate (table) bias equal to approximately 200 watts, a gap equal to approximately 220 mm, a process time equal to approximately 24 seconds, a deposition rate equal to approximately 16 nm/minute, a chamber pressure equal to approximately 65 mTorr, an Argon flow rate equal to approximately 480 sccm, and a Nitrogen flow rate equal to approximately 24 sccm. In addition, a number of deposition cycles can be perform, and the TaN(LND1) process can be repeated a number of times (1-10) without adverse affects.

In another example, a TaN(LND1) process can be performed using the following parameters: a DC power equal to approximately 1500 watts, an ICP power equal to approximately 5250 watts, an RF substrate (table) bias equal to approximately 200 watts, a gap equal to approximately 220 mm, a process time equal to approximately 5.3 seconds, a deposition rate equal to approximately 30 nm/minute, a chamber pressure equal to approximately 5 mTorr, an Argon flow rate equal to approximately 105 sccm and a Nitrogen flow rate equal to approximately 23 sccm.

In a different example, a TaN(LND2) process can be performed using the following parameters: a DC power equal to approximately 1500 watts, an ICP power equal to approximately 5250 watts, an RF substrate (table) bias equal to approximately 400 watts, a gap equal to approximately 220 mm, a process time equal to approximately 5.4 seconds, a deposition rate equal to approximately 30 nm/minute, a chamber pressure equal to approximately 5 mTorr, an Argon flow rate equal to approximately 105 sccm and a Nitrogen flow rate equal to approximately 23 sccm.

When multiple cycles are performed the process parameters can remain constant, or alternately one or process parameters can change during different cycles. The LND process can be used to deposit a barrier layer and multiple cycles may be required. For example, the barrier can comprise a metal.

Procedure 300 can end in 350.

In some cases the wafer can be removed from the processing chamber and measured in another chamber. For example, an optical digital profile (ODP) tool can be used. In addition, Scanning Electron Microscope (SEM) data and/or TEM data can be used.

Measurement data can be obtained during a process and used to determine when to stop the process. Measurement data can include chamber pressure data, chamber temperature data, substrate temperature data, process gas chemistry data, process gas flow rate data, target material data, ICP power data, substrate position data, target power data, RF substrate bias power data, processing time data, process recipe data, or a combination thereof.

A processing time may be used to determine when to stop a process. Alternately, thickness data can be used to determine when to stop a process.

The additional process can comprise an LND process, an NND process, a conventional deposition process, an etching process, a deposition/etch process, a cleaning process, a measurement process, a storing process, an electroplating process, or a combination thereof. The additional processes can be performed in the same processing chamber or other processing chambers. For example, one or more processing chambers can be coupled to each other by a transfer system.

Figure 4:
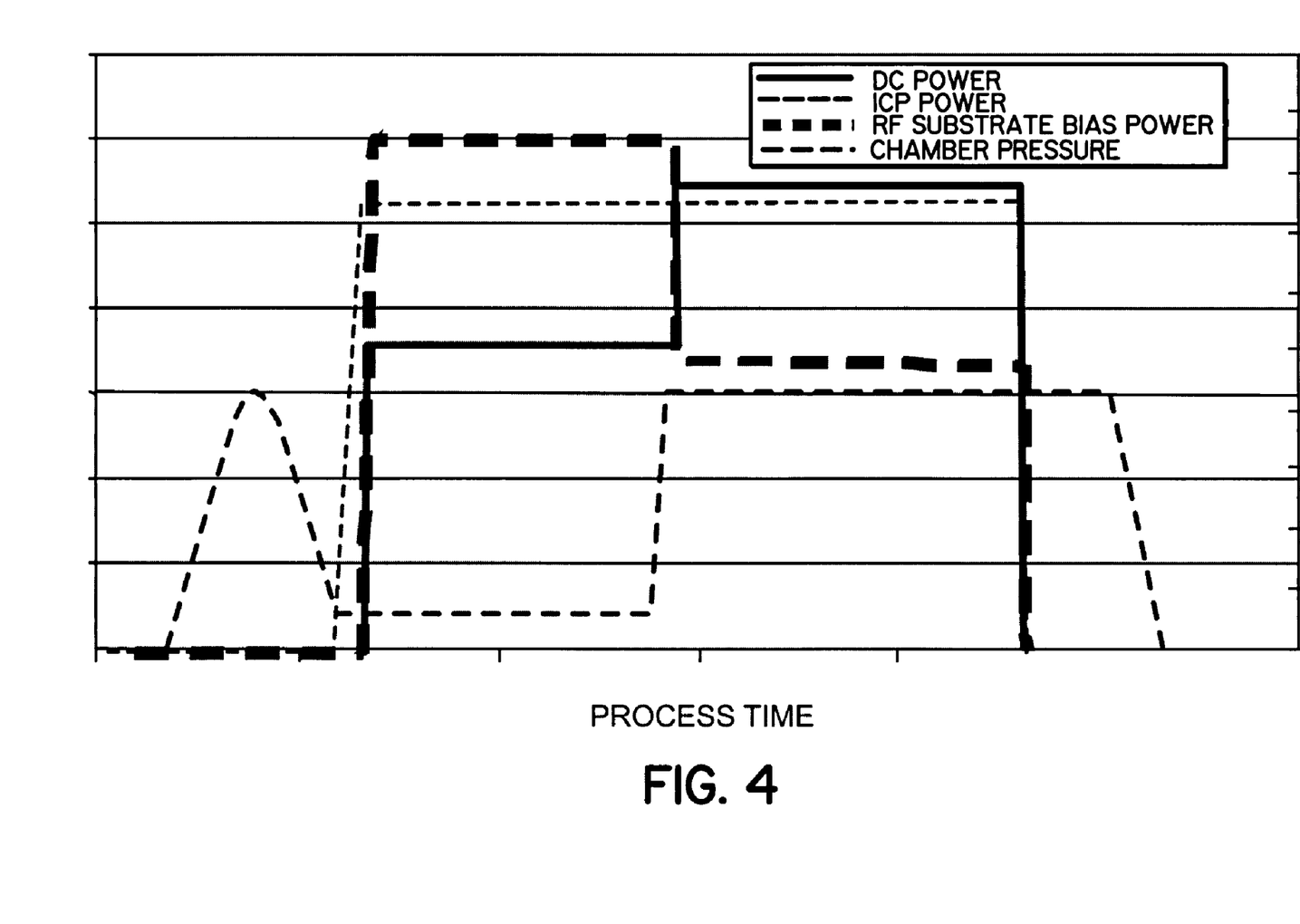
FIG. 4 illustrates an exemplary deposition process in accordance with an embodiment of the invention.

FIG. 4 illustrates an exemplary deposition process in accordance with an embodiment of the invention. In the illustrated embodiment, a simplified graph of the deposition process is shown. For example, a simplified process 400 can comprise an NND deposition process time period 410 and a standard deposition time period 420.

During the NND deposition process time period 410, the chamber pressure can be established at a first NND pressure, and the ICP power can be established at a first NND ICP power level. For example, the first NND pressure can be approximately 5 mtorr, and the first NND ICP power level can be approximately 5250 watts. In addition, during the NND deposition process time period 410, the DC power can be established at a first NND DC power level, and simultaneously the RF substrate bias power can be established at a first NND RF substrate bias power level. For example, the first NND DC power level can be between approximately 500 watts and approximately 4000 watts, and the first NND RF substrate bias power level can be between approximately 200 watts and approximately 300 watts.

The substrate can be loaded onto the wafer table into the processing chamber and the wafer table can be set to process height. A pump can be used along with a process gas system to control the chamber pressure. The substrate can be electrostatically chucked onto the wafer table. In addition, backside gas cooling can be initiated.

During the post-process time period, the wafer table can be set to an extraction height. The flow of process gas can be stopped, and the backside gas cooling can be stopped. The substrate can be electro-statically de-chucked from the wafer table. Chamber pressure can be stabilized; the substrate can be removed from the wafer table; and the substrate can be transfer out of the processing chamber.

A single NND process time period is shown in FIG. 4, but this is not required for the invention. In alternate embodiments, a substrate can be processed using one or more NND process time periods in which the processing conditions can be different. For example, processing conditions may be established for isolated features during one NND process time period, and other processing conditions may be established for closely packed features during another NND process time period.

Figure 5:
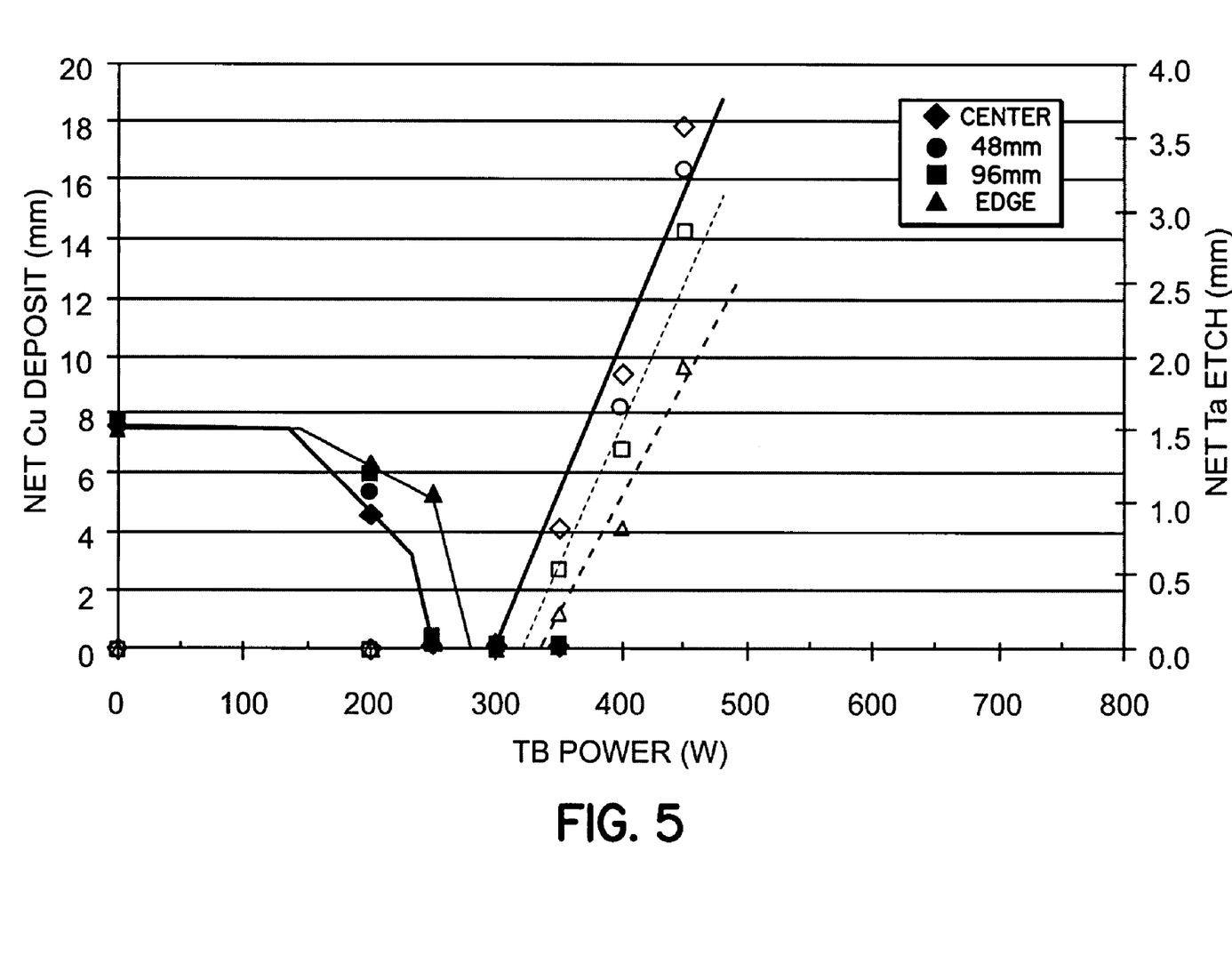
FIG. 5 illustrates an exemplary graph of an NND process space in accordance with an embodiment of the invention.

FIG. 5 illustrates an exemplary graph of an NND process space in accordance with an embodiment of the invention. As shown in the illustrated embodiment, an NND process space can be defined by using RF bias power for the x-axis and using the net Cu deposition amount for one y-axis and the net Ta etch amount for another y-axis. In alternate embodiments, other process parameters and/or combinations of process parameters may be used to define an NND process space. Data points are provided for different locations on a substrate.

Figure 6:
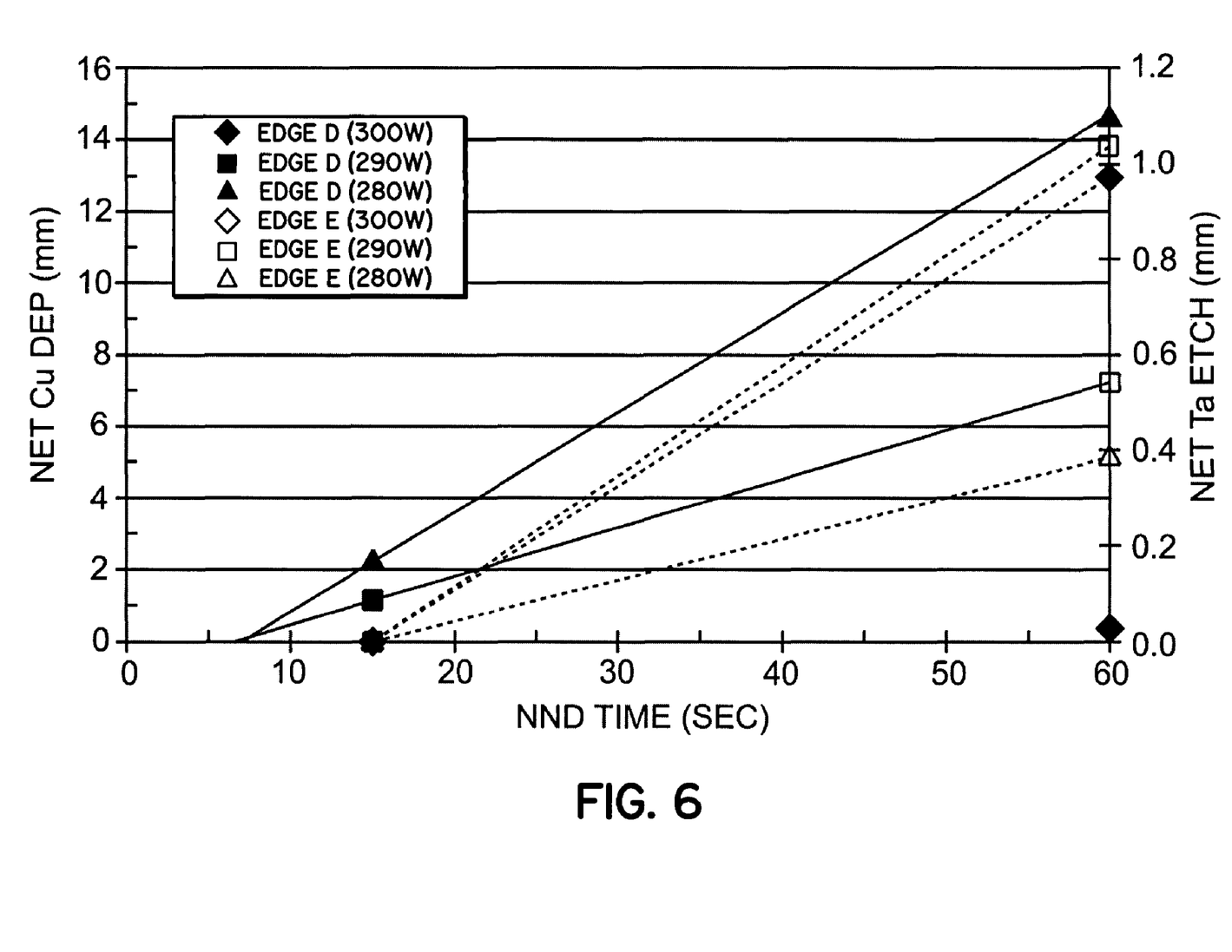
FIG. 6 illustrates another exemplary graph of an NND process space in accordance with an embodiment of the invention.

FIG. 6 illustrates another exemplary graph of an NND process space in accordance with an embodiment of the invention. As shown in the illustrated embodiment, an NND process space can be defined by using RF bias power for the x-axis and using the net Cu deposition amount for one y-axis and the net Ta etch amount for another y-axis. In alternate embodiments, other process parameters and/or combinations of process parameters may be used to define an NND process space. Data points are provided for different locations on a substrate.

Figure 7:
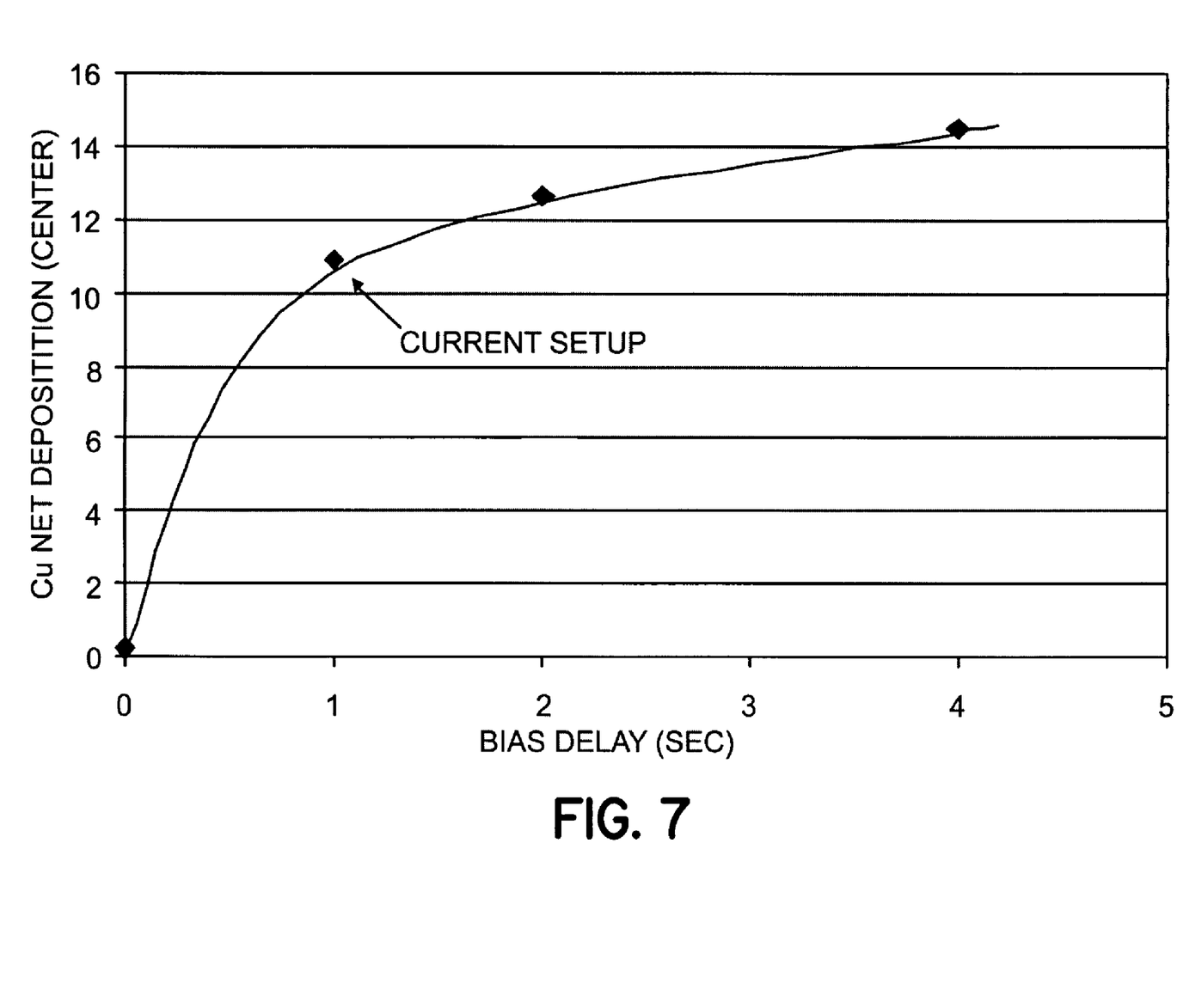
FIG. 7 illustrates an exemplary graph of an NND process in accordance with an embodiment of the invention.

FIG. 7 illustrates an exemplary graph of an NND process in accordance with an embodiment of the invention. As shown in the illustrated embodiment, the amount of net deposition is dependent on the bias delay, which is the delay between the time the DC power is applied and the time at which the substrate bias is applied.

Figure 8:
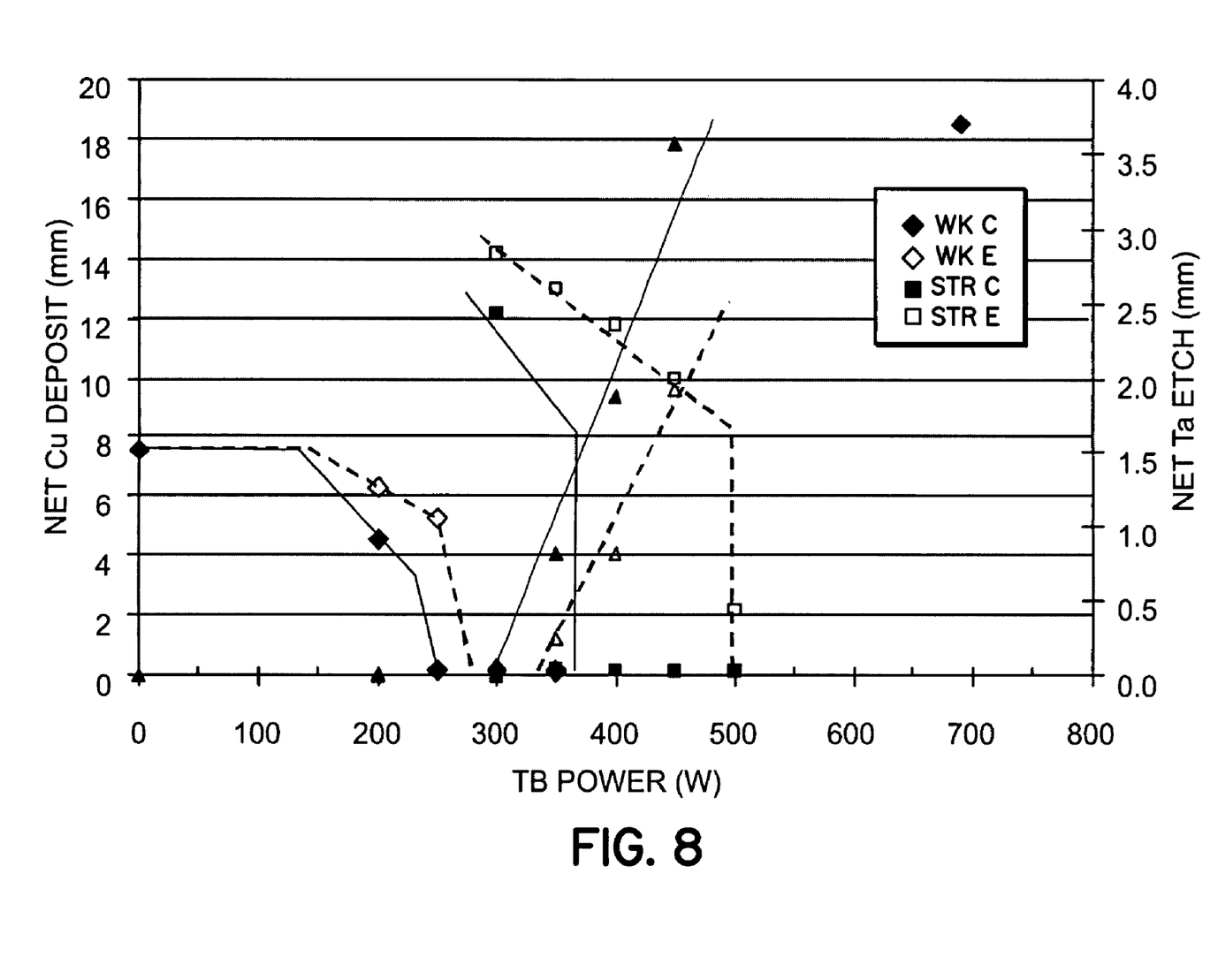
FIG. 8 illustrates another exemplary graph of an NND process space in accordance with an embodiment of the invention.

FIG. 8 illustrates another exemplary graph of an NND process space in accordance with an embodiment of the invention. As shown in the illustrated embodiment, an NND process space can be defined by using RF bias power for the x-axis and using the net Cu deposition amount for one y-axis and the net Ta etch amount for another y-axis. In alternate embodiments, other process parameters and/or combinations of process parameters may be used to define an NND process space. Data points are provided for different locations on a substrate and for different magnetic field strengths. For example, STR is a strong magnetic field and WK is a weak magnetic field.

In the metallization of high aspect ratio via holes and trenches on semiconductor wafers, it is required that the barrier layer and the seed layer have good sidewall and bottom coverage. The barrier layer needs to be as thin as possible without sacrificing its barrier properties. The barrier layer must be thin because its electrical resistance, which adds to the electrical resistance of the via structure, must be minimized. It needs to be conformal and continuous to prevent diffusion of seed layer material into the dielectric layer and into other layers to prevent reliability problems. This requires that the barrier layer thickness must be well controlled and minimized especially at the bottom of the via. A thick barrier layer at the bottom of the via may add substantial undesirable electrical resistance to the resistance of interconnect metallization.

In the LND barrier deposition process, metal can be sputtered off the target at a low rate. This results in only a minor dilution of the process gas ion plasma. The metal ionizes and is deposited on the wafer with a rate that can be less than 10 nm/min. A low bias is applied to the wafer to attract the ions to the bottom of the feature. Because of the low field deposition rate and the low bias, the metal deposits with little or no overhang developing. The sidewall coverage is enhanced, and the result is a highly conformal metal deposition, ideal for a barrier metal.

If the process is to be a reactive one, such as TaN, the N2 or another reactive gas can be added during the LND barrier deposition process. Typically, the nitrogen flow is such that the iPVD process is performed in a target non-poisoned mode or metal mode, which is more desirable; however, the poisoned mode can be achieved by increasing the reactive gas flow. Nitrogen flow can be further varied to grade the metal nitride composition from a nitrogen rich to nitrogen deficient metal nitride rather easily with this invention. This feature is highly desirable because it allows the user to tailor the stoichiometry of the metal nitride. Whether better barrier properties (higher N2 content) are desired, or better wetting properties (lower N2 content) are necessary, this invention can accommodate the user's needs. For example, the sidewall stoichiometry of a metal nitride can be controlled throughout the deposition process by varying nitrogen or reactive gas flow. In addition, the nitridization of a metal film sidewall can be controlled by using an Ar/N2 ion plasma subsequent to the deposition step.

Within the NND processing window, little or no etching of the interlayer dielectric or pre-metalized surface occurs during this process as a result of balancing the deposition and etching rates of the metal by application of an appropriate wafer bias.

If the process is to be a reactive one, such as TaN, the N2 or another reactive gas can be added during the NND process. Typically, the nitrogen flow is such that the iPVD process is performed in a target non-poisoned mode or metal mode, which is more desirable; however, the poisoned mode can be achieved by increasing the reactive gas flow. Nitrogen flow can be further varied to grade the metal nitride composition from a nitrogen rich to nitrogen deficient metal nitride rather easily with this invention. This feature is highly desirable because it allows the user to tailor the stiochiometry of the metal nitride. Whether better barrier properties (higher N2 content) are desired, or better wetting properties (lower N2 content) are necessary, this invention can accommodate the user's needs. For example, the sidewall stoichiometry of a metal nitride can be controlled throughout the deposition process by varying nitrogen or reactive gas flow. In addition, the nitridization of a metal film sidewall can be controlled by using Ar/N2 ion plasma subsequent to the deposition step.

Although only certain embodiments of this invention have been described in detail above, those skilled in the art will readily appreciate that many modifications are possible in the embodiments without materially departing from the novel teachings and advantages of this invention. Accordingly, all such modifications are intended to be included within the scope of this invention.

What is claimed is:

1. A method of operating a deposition system to perform a tantalum deposition process comprising:
   positioning a patterned substrate on a wafer table within a processing chamber;
   establishing a first set of process parameters during a pre-process time, including:
      flowing an argon process gas into the processing chamber from a gas supply system to the processing chamber,
      establishing a substrate temperature of less than 0 degrees C., and
      coupling an ICP power from an ICP source with an antenna to the processing chamber to create a high density plasma within the processing chamber; and
   during a processing time, exposing the patterned substrate to the high-density plasma and performing a net deposition step by depositing a tantalum barrier layer material into at least one feature on the patterned substrate while simultaneously etching tantalum barrier layer material from a field area of the patterned substrate by:
      maintaining the substrate temperature at less than 0 degrees C.,
      coupling a target power from a target power source to a tantalum target positioned within the deposition system, the target power being greater than approximately 300 W and less than approximately 4000 W,
      coupling a variable magnetic field from a magnet assembly to the target to produce different magnetic fields over the target for a duration of the processing time; and
      substantially simultaneously controlling the coupling of the target power to the tantalum target with a coupling of an RF substrate bias power of less than approximately 300 W from an RF bias generator to the wafer table in the processing chamber to provide a net deposition rate of not more than approximately 10 nm/min for a duration of the processing time.

2. The method of claim 1 wherein the preprocess time is in a range of from approximately 0 seconds to approximately 50 seconds and the processing time is in a range of from approximately 10 seconds to approximately 500 seconds.

3. The method of claim 1 wherein the coupled ICP power has a frequency in the range of from 1 MHz to 100 MHz.

4. The method of claim 1 wherein the coupled ICP power is greater than approximately 3000 watts and less than approximately 6000 watts.

5. The method of claim 1 wherein the deposition rate during the processing time includes a field deposition rate, a sidewall deposition rate, and a bottom surface deposition rate.

6. The method of claim 5 wherein the field deposition rate is less than approximately +5 nm/min.

7. The method of claim 5 wherein the sidewall deposition rate is in a range of from greater than 0 nm/min to approximately +10 nm/min.

8. The method of claim 7 wherein the sidewall deposition rate is less than approximately +5 nm/min.

9. The method of claim 5 wherein the bottom surface deposition rate is in a range of from approximately −10 nm/min to approximately +10 nm/min.

10. The method of claim 9 wherein the bottom surface deposition rate is in a range of from approximately −5 nm/min to approximately +5 nm/min.

11. The method of claim 1 wherein the net deposition step includes repairing a previously deposited tantalum barrier layer.

12. The method of claim 1 wherein the net deposition step includes depositing the tantalum barrier layer material on a previously deposited tantalum barrier layer.

13. The method of claim 1 wherein the net deposition step includes creating a punch through in at least one feature of the patterned substrate.

14. The method of claim 1 wherein the exposing of the patterned substrate to the high-density plasma includes performing an ionized physical vapor deposition (iPVD) process on the patterned substrate.

15. The method of claim 1 wherein the coupling of the target power from the target power source to the tantalum target is operable to sputter tantalum from the tantalum target and into the high density plasma and the tantalum is deposited onto the patterned substrate at the net deposition rate.

16. The method of claim 15 further comprising:
forming ions of tantalum and argon in the high density plasma; and
performing the net deposition step by directing the ions of tantalum and argon toward the patterned substrate with the substrate bias power.

17. The method of claim 13 wherein the net deposition step further includes repairing the punch through by depositing tantalum barrier layer material in the punch through.

18. A method of operating a deposition system to perform a deposition process comprising:
(i) positioning a patterned substrate on a wafer table within a processing chamber;
(ii) establishing a first set of process parameters during a preprocess time, including:
(a) flowing an argon process gas into the processing chamber from a gas supply system to the processing chamber,
(b) establishing a substrate temperature of less than 0 degrees C., and
(c) coupling an ICP power from an ICP source with an antenna to the processing chamber to create a high density plasma within the processing chamber; and
(iii) during a processing time, exposing the patterned substrate to the high-density plasma and performing a net deposition step by depositing a barrier layer material into at least one feature on the patterned substrate while simultaneously etching barrier layer material from a field area of the patterned substrate by:

(a) maintaining the substrate temperature at less than 0 degrees C.,
(b) coupling a target power from a target power source to a target positioned within the deposition system, the target power being greater than approximately 300 W and less than approximately 4000 W,
(c) coupling a variable magnetic field from an electromagnet assembly to the target to produce different magnetic fields over the target for a duration of the processing time; and
(d) simultaneously controlling a coupling of an RF substrate bias power of less than approximately 300 W from an RF bias generator to the wafer table in the processing chamber to be within approximately 1 second of the coupling of the target power to the target, thereby providing a net deposition rate of not more than approximately 10 nm/min for the duration of the processing time.

19. The method of claim 18 wherein the deposition rate during the processing time includes a field deposition rate, a sidewall deposition rate, and a bottom surface deposition rate.

20. The method of claim 19 wherein the field deposition rate is less than approximately +5 nm/min.

21. The method of claim 19 wherein the sidewall deposition rate is in a range of from greater than 0 nm/min to approximately +10 nm/min.

22. The method of claim 21 wherein the sidewall deposition rate is less than approximately +5 nm/min.

23. The method of claim 19 wherein the bottom surface deposition rate is in a range of from approximately −10 nm/min to approximately +10 nm/min.

24. The method of claim 23 wherein the bottom surface deposition rate is in a range of from approximately −5 nm/min to approximately +5 nm/min.

25. The method of claim 18 wherein the net deposition step includes depositing tantalum as the barrier layer material on a previously deposited barrier layer comprised of tantalum.

26. The method of claim 18 wherein the net deposition step includes creating a punch through in at least one feature of the patterned substrate.

27. The method of claim 18 wherein the exposing of the patterned substrate to the high-density plasma includes performing an ionized physical vapor deposition (iPVD) process on the patterned substrate.

28. The method of claim 18 wherein the coupling of the target power from the target power source to the target is operable to sputter barrier layer material from the target and into the high density plasma and the barrier layer material is deposited onto the patterned substrate at the net deposition rate.

29. The method of claim 28 further comprising:
forming ions of the barrier layer material and argon in the high density plasma; and
performing the net deposition step by directing the ions of the barrier layer material and argon toward the patterned substrate with the substrate bias power.

30. The method of claim 26 wherein the net deposition step further includes repairing the punch through by depositing the barrier layer material in the punch through.

* * * * *